United States Patent [19]
Lim et al.

[11] Patent Number: 5,614,857
[45] Date of Patent: Mar. 25, 1997

[54] HYSTERESIS SYSTEM WITH CONSTANT THRESHOLD VOLTAGE

[75] Inventors: Chang-sik Lim, Kwangmyeong-si; Young-gi Ryou, Seoul, both of Rep. of Korea

[73] Assignee: Samsung Electronics Co., Ltd., Suwon, Rep. of Korea

[21] Appl. No.: 609,110

[22] Filed: Feb. 29, 1996

[30] Foreign Application Priority Data

Jun. 12, 1995 [KR] Rep. of Korea .................. 95-15441

[51] Int. Cl.⁶ ............................................. H03K 3/037
[52] U.S. Cl. .................................... 327/205; 327/74
[58] Field of Search .............................. 327/205, 206, 327/68, 74, 75, 76, 87

[56] References Cited

U.S. PATENT DOCUMENTS

| | | | |
|---|---|---|---|
| 5,373,400 | 12/1994 | Kovacs | 327/74 |
| 5,394,020 | 2/1995 | Nienaber | 327/74 |
| 5,418,409 | 5/1995 | Kuhn | 327/205 |
| 5,548,227 | 8/1996 | Minami | 327/74 |

OTHER PUBLICATIONS

Tiponut et al., "One Chip Comparator Circuit Generates Pulsed Output," Electronics, vol. 51, No. 25, Dec. 7, 1978, p. 125.

*Primary Examiner*—Toan Tran
*Attorney, Agent, or Firm*—Cushman Darby & Cushman IP Group of Pillsbury Madison & Sutro LLP

[57] ABSTRACT

A hysteresis system with constant threshold voltage, regardless of an increase or decrease of an output signal by detecting the increase/decrease state of the input signal, and includes a second voltage signal generator for generating a second voltage signal which is gradually increased when a first voltage signal inputted is high and is gradually reduced when the first voltage signal inputted is low, a voltage comparator for comparing the reference threshold voltage signal with the second voltage signal generated from the second voltage signal generator and producing a corresponding value; a threshold voltage initialization circuit for comparing reference voltage with the first voltage signal inputted and producing a threshold voltage initialization signal in accordance with a corresponding value; and a threshold voltage generator to which an output signal produced from the voltage comparator and the threshold voltage initialization signal produced from the threshold voltage initialization circuit are fed back, for producing a threshold voltage signal corresponding to a feedback value.

8 Claims, 4 Drawing Sheets

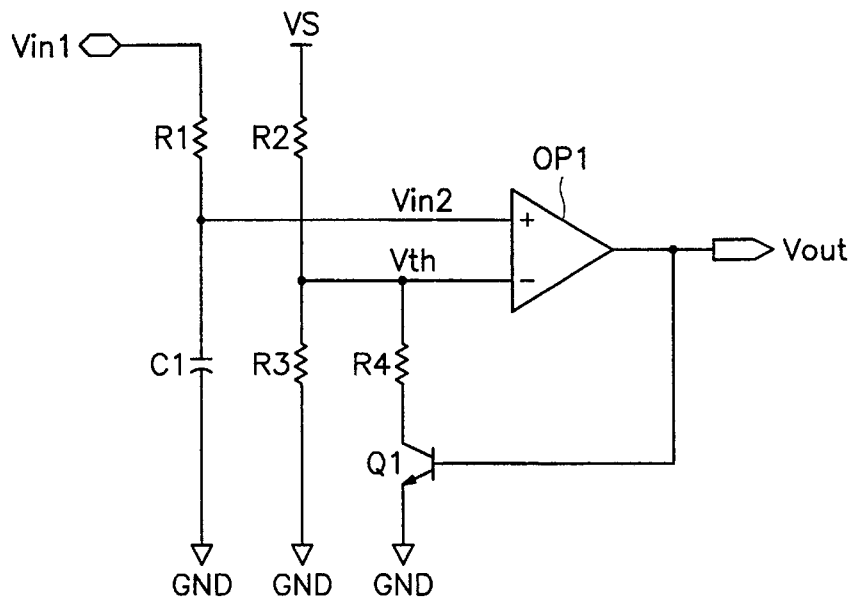
FIG.1(Prior Art)
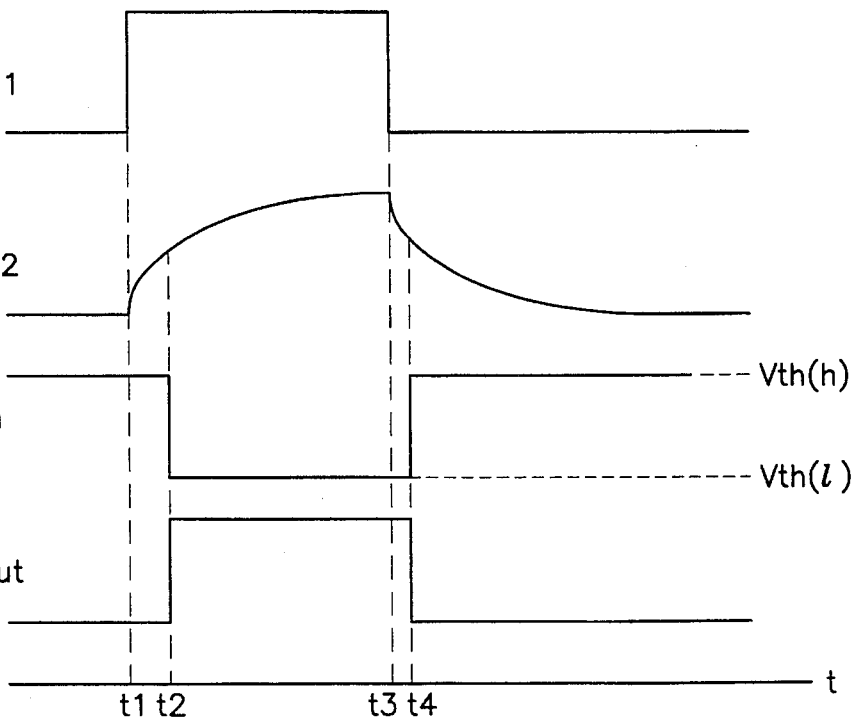
FIG.2A Vin1 (Prior Art)
FIG.2B Vin2 (Prior Art)
FIG.2C Vth (Prior Art)
FIG.2D Vout (Prior Art)

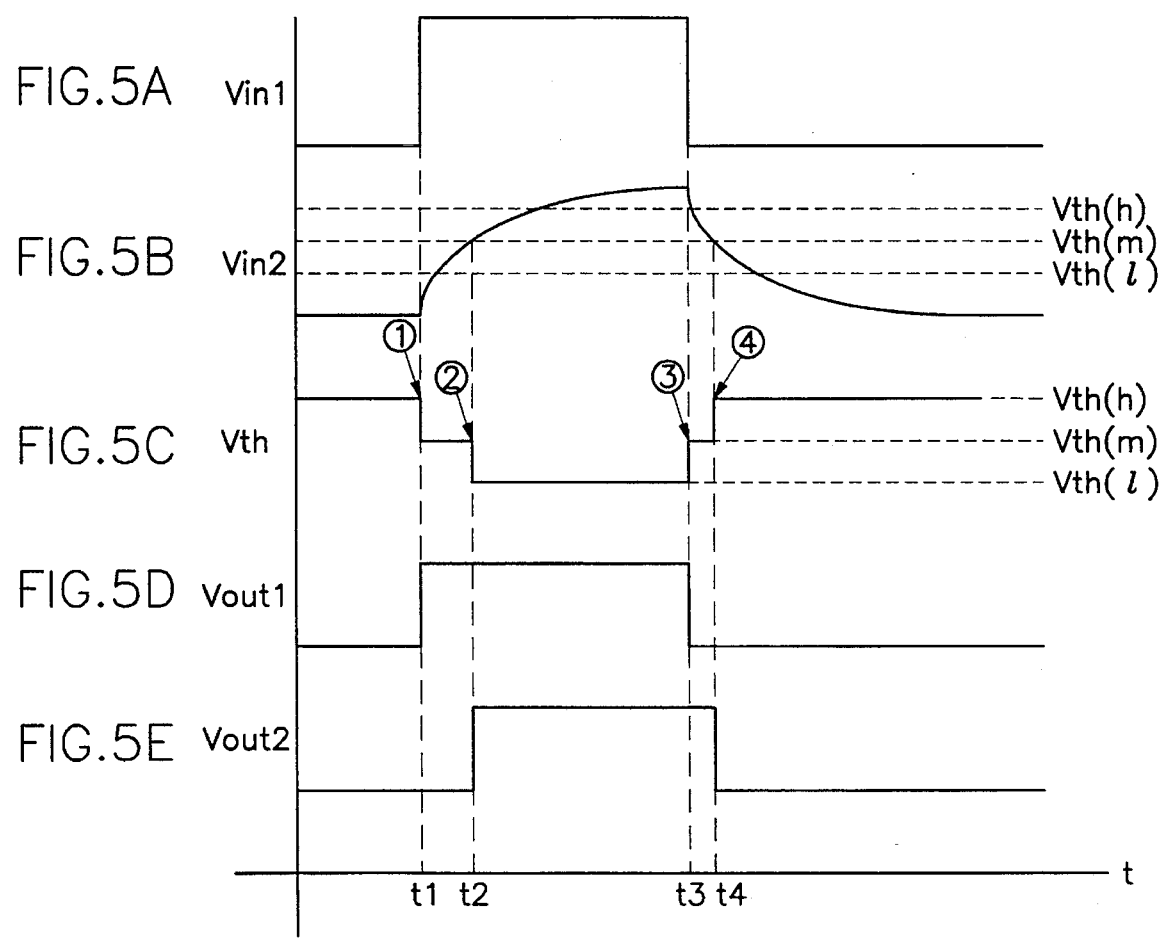

HYSTERESIS SYSTEM WITH CONSTANT THRESHOLD VOLTAGE

BACKGROUND OF THE INVENTION

A. Field of the Invention

The present invention relates to a hysteresis system with a constant threshold voltage. More particularly, the present invention relates to a hysteresis system which has a constant threshold voltage regardless of an increase or decrease of an output signal from a hysteresis system

B. Description of the Prior Art

A conventional hysteresis system will be described hereinafter in detail with reference to accompanying drawings.

FIG. 1 shows a circuit diagram illustrating a conventional hysteresis system, and FIGS. 2A to 2D are timing charts illustrating operations of the conventional hysteresis system of FIG. 1.

Referring to FIG. 1, the conventional hysteresis system comprises a first resistor R1 with one terminal for receiving an input signal Vin1, a capacitor C1 with one terminal connected to the other terminal of the first resistor R1 and with the other terminal grounded, a second resistor R2 with one terminal for receiving power VS, a third resistor R3 with one terminal connected to the other terminal of the second resistor R2 and with the other terminal grounded, a fourth resistor R4 with one terminal connected to the other terminal of the second resistor R2, an operational amplifier OP1 with a non-inverting input terminal (+) connected to the other terminal of the first resistor R1 and with an inverting input terminal connected to the other terminal of the second resistor R2, and a transistor Q1 with a collector connected to the other terminal of the fourth resistor R4, with a base connected to an output terminal of the operation amplifier OP1 and with an emitter grounded.

The operation of the conventional hysteresis system will be described hereinafter.

If a first input signal Vin1 is inputted as illustrated in FIG. 2A while power VS is applied, a waveform of a second input signal Vin2 is formed according to values of the first resistor R1 and the capacitor C1 as illustrated in FIG. 2B.

That is, if the first input signal Vin1 is inputted in a high level (t1), the value of the second input signal Vin2 is gradually increased by capacitance of the capacitor C1 as the capacitor C1 is charged, and the value of the second input signal Vin2 is gradually reduced if the value of the first input signal Vin1 is again changed to a low signal (t3). As a result, the waveform of the second input signal Vin2 is formed as illustrated in FIG. 2B, and the second input signal Vin2 is inputted to the non-inverting input terminal of the operational amplifier OP1.

On the other hand, the threshold voltage Vth inputted to the inverting input terminal of the operational amplifier OP1 is determined according to the ratio of the second resistor R2 and the third resistor R3 and maintained constant at first when the power VS is applied, and an output signal Vout of the operational amplifier OP1 is maintained at the low level. From the moment that the value of the second input signal Vin2 is greater than a value of the threshold voltage Vth (t2), the output signal Vout of the operational amplifier OP1 is changed to the low level, and concurrently the transistor Q1 is turned OFF, thereby changing the threshold voltage Vth into the high level.

Accordingly, the conventional hysteresis system has its threshold voltage changed according to the output signal Vout of the operational amplifier OP1. If the threshold voltage is defined as a first threshold voltage Vth(1) when the output signal Vout of the operational amplifier OP1 is at the high level, and the threshold voltage is defined as a second threshold voltage Vth(h) when the output signal Vout of the operational amplifier OP1 is at the low level, the hysteresis voltage Vhys can be expressed as follows:

$$Vhys = Vth(h) - Vth(1) \quad (1)$$

That is, the conventional hysteresis system has a disadvantage that it is not possible to apply to a system requiring a constant threshold voltage regardless of an increase or decrease of the input signal, since it has its threshold voltage changed according to the output terminal of the operation amplifier.

SUMMARY OF THE INVENTION

The present invention overcomes the problem and disadvantage of the prior art by providing a hysteresis system with a constant threshold voltage regardless of an increase or decrease of an output signal from a hysteresis system by detecting increase/reduction state of an input signal to the hysteresis system.

To achieve the objects and in accordance with the purpose of the invention, as embodied and broadly described herein, the hysteresis system with a constant threshold voltage of the present invention comprises a second voltage signal generator for generating a second voltage signal which is gradually increased when a first voltage signal inputted is high and is gradually reduced when the first voltage signal inputted is low; a voltage comparator for comparing a reference threshold voltage signal with the second voltage signal generated from the second voltage signal generator and producing a corresponding value; a threshold voltage initialization circuit for comparing the reference voltage with the first voltage signal inputted, and producing a threshold voltage initialization signal in accordance with a corresponding value; and a threshold voltage generator to which an output signal produced from the voltage comparator and the threshold voltage initialization signal produced from the threshold voltage initialization circuit are fed back, and for producing a threshold voltage signal corresponding to a feedback value.

Additional objects and advantages of the invention are set forth in part in the description which follows, and will be clear from the description. The objects and advantages of the invention will be realized and attained by means of the elements and combinations particularly pointed out in the appended claims.

BRIEF DESCRIPTION OF THE DRAWINGS

The accompanying drawings illustrate the prior art, and embodiments of the invention and, together with the description, serve to explain the principles of the invention. In the drawings:

FIG. 1 is a circuit diagram a illustrating the conventional hysteresis system;

FIGS. 2A to 2D are timing charts illustrating operations of the conventional hysteresis system of FIG. 1;

FIGS. 5A to 5E are timing charts illustrating operations of the hysteresis system of FIG. 3.

DESCRIPTION OF THE PREFERRED EMBODIMENT

Figure 3:
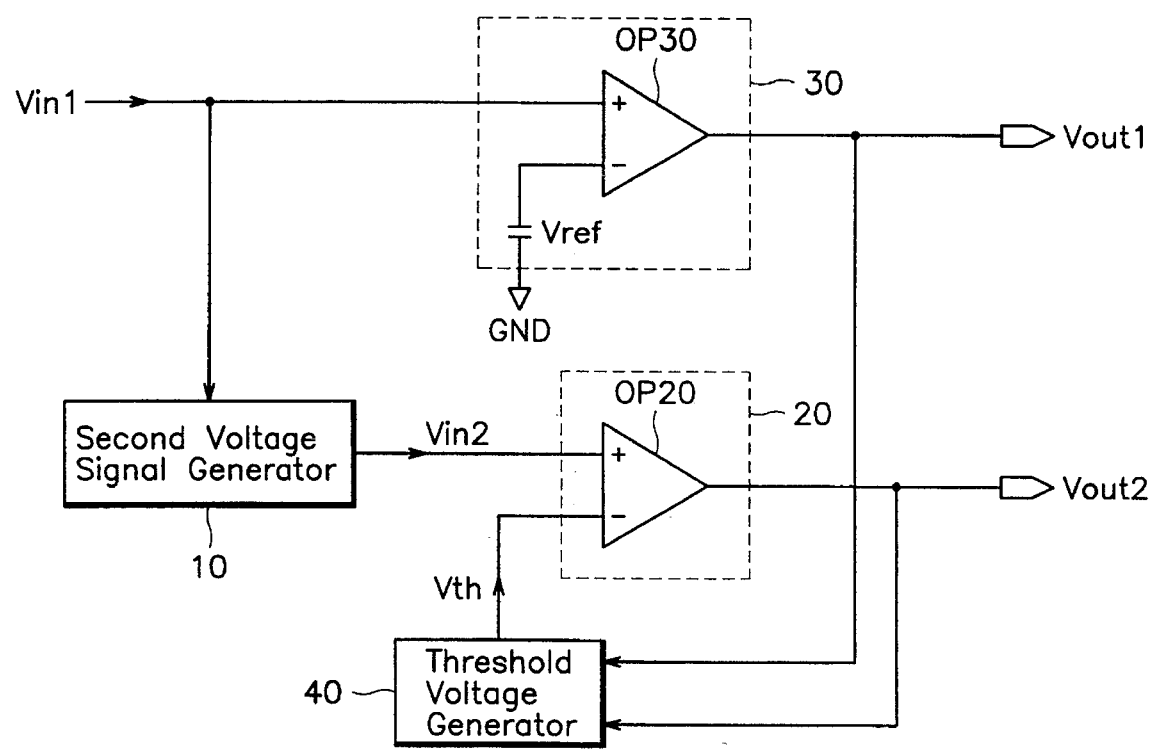
FIG. 3 is a block diagram illustrating a hysteresis system with constant threshold voltage according to a preferred embodiment of the present invention.
Figure 4:
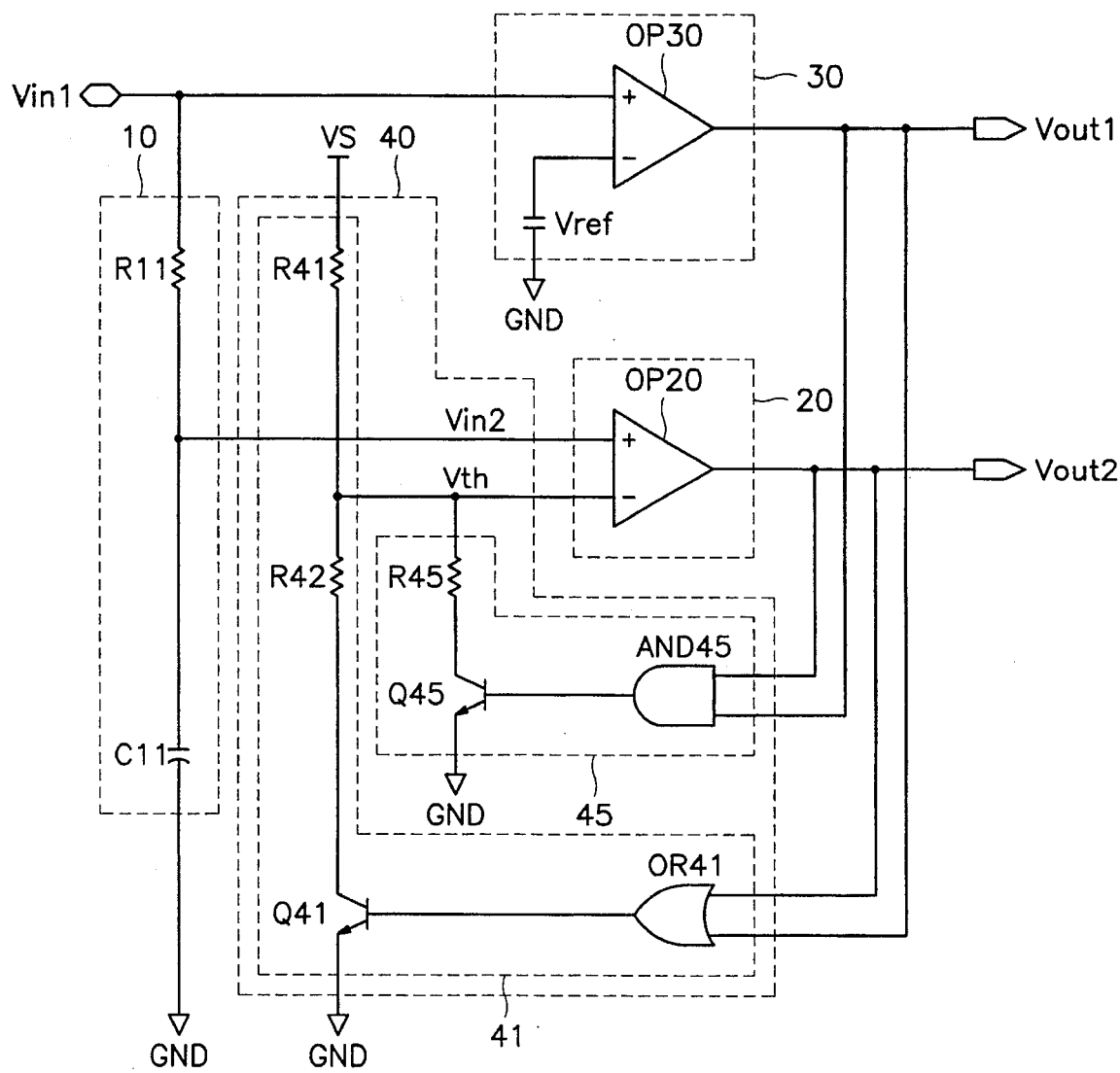
FIG. 4 is a circuit diagram illustrating the hysteresis system of FIG. 3.

Reference will now be made in detail to preferred embodiment of the present invention, an example of which is illustrated in FIGS. 3 and 4 of the accompanying drawings. Wherever possible, the same reference numbers will be used throughout the drawings to refer to the same or like parts.

Referring to FIGS. 3 and 4, a hysteresis system with constant threshold voltage according to a preferred embodiment of the present invention comprises a second voltage signal generator 10 for generating a second voltage signal Vin2 which is gradually increased when a first voltage signal Vin1 inputted is high and is gradually reduced when the first voltage signal Vin1 inputted is low; a voltage comparator 20 for comparing a reference threshold voltage signal with the second voltage signal Vin2 generated from the second voltage signal generator 10 and producing a corresponding value; a threshold voltage initialization circuit 30 for comparing reference voltage with the first voltage signal Vin1 inputted, and producing a threshold voltage initialization signal Vth in accordance with a corresponding value; and a threshold voltage generator 40 to which an output signal produced from the voltage comparator 20 and the threshold voltage initialization signal Vth produced from the threshold voltage initialization circuit 40 are fed back, and for producing a threshold voltage signal Vth corresponding to a feedback value.

The second voltage signal generator 10 includes a first resistor R11 with one terminal for receiving the first voltage signal Vin1, and a capacitor C11 with one terminal connected to the other terminal of the first resistor R11 and with the other terminal grounded.

The voltage comparator 20 includes a first operational amplifier OP20 with a non-inverting input terminal connected to the other terminal of the first resistor R11 of the second voltage signal generator 10.

The threshold voltage initialization circuit 30 includes a second operational amplifier OP30 with a non-inverting input terminal for receiving the first voltage signal Vin1 and with an inverting input terminal for receiving the reference voltage.

The threshold voltage generator 40 includes a first threshold voltage generator 41 for receiving the output signal Vout2 of the voltage comparator 20 and the threshold voltage initialization signal Vout1 of the threshold voltage initialization circuit 30, and generating a first threshold voltage or second threshold voltage in accordance with a corresponding signal; and a second threshold voltage generator 45 for receiving the output signal Vout2 of the voltage comparator 20 and the threshold voltage initialization signal Vout1 of the threshold voltage initialization circuit 30, and maintaining the second threshold voltage of the first threshold voltage generator 41 or generating third threshold voltage.

The first threshold voltage generator 41 includes a first resistor R41 with one terminal connected to power VS and with the other terminal connected to the inverting input terminal of the first operational amplifier OP20 of the voltage comparator 20; a second resistor R42 with one terminal connected to the other terminal of the first resistor R41; a first transistor Q41 with a collector connected to the other terminal of the second resistor R42 and with an emitter grounded; and an OR gate OR with a first input terminal connected to the output terminal of the first operational amplifier OP20 of the voltage comparator 20, with a second input terminal connected to the output terminal of the first operational amplifier OP20 of the threshold voltage initialization circuit 30, and with an output terminal connected to a base of the first transistor Q41.

The second threshold voltage generator 45 includes a third resistor R45 with one terminal connected to the other terminal of the first resistor R41 of the first threshold voltage generator 41; a second transistor Q45 with a collector connected to the other terminal of the third resistor R45 and with an emitter grounded; and an AND gate AND with a first input terminal connected to the output terminal of the first operational amplifier OP20 of the voltage comparator 20, with a second input terminal connected to the output terminal of the second operational amplifier OP30 of the threshold voltage initialization circuit 30, and with an output terminal connected to a base of the second transistor Q45.

The operation of the hysteresis system of FIGS. 3 and 4 will be hereinafter described in detail with reference to FIGS. 5A–5E of the accompanying drawings.

Referring to FIG. 5A, if the first voltage signal Vin1 is applied in a low level and then changed to a high level (t1) while power is being applied, the value of the second voltage signal Vin2 is gradually increased as illustrated in FIG. 5B as the capacitor C11 is charged through the first resistor R11 of the second voltage signal generator 10.

In addition, the threshold voltage initialization signal Vout1, which is the output signal of the second operational amplifier OP30 of the threshold voltage initialization circuit 30 is changed to a high level as the first voltage signal Vin1 is applied at the high level. As a result, the output signal of the OR gate OR41 of the threshold voltage generator 40 is changed to the high level, thereby turning ON the first transistor Q41.

Accordingly, the value of the power VS is divided by the first resistor R41 and the second resistor R42 of the threshold voltage generator 40, and the value of the threshold voltage Vth is controlled from the second threshold voltage Vth(h) to the third threshold voltage Vth(m), as illustrated in FIG. 5C.

In addition, the output signal Vout2 of the first operational amplifier OP20 of the voltage comparator 20 is changed from low to high from the moment that the value of the second voltage signal Vin2 is increased to be the same as that of the threshold voltage Vth(m) as the capacitor C11 of the second voltage signal generator 10 is charged. As a result, the output signal of the AND gate AND45 of the threshold voltage generator 40 is changed to become high, thereby turning ON the second transistor Q45.

Accordingly, the value of the power VS is divided by the parallel resistance value of the first resistor R41, the second resistor R42 and the third resistor R45, thereby controlling the value of the threshold voltage Vth from the third voltage value Vth(m) to the first threshold voltage Vth(1), as illustrated in FIG. 5C.

While the value of the first voltage signal Vin1 is maintained high, the value of the second voltage signal Vin2 is continually increased, the value of the first threshold voltage Vth is continually maintained constant, the first threshold voltage Vth(1), and the output signal Vout2 of the voltage comparator 20 is continually maintained high.

Referring to FIG. 5A, if the value of the first voltage signal Vin1 is applied at the high level and changed to the low level (t3), the capacitor C11 of the second voltage signal generator 10 is discharged through the first resistor R11 and the value of the second voltage signal Vin2 is gradually reduced, as illustrated in FIG. 5B.

In addition, if the value of the first voltage signal Vin1 is applied at the high level and changed to the low level (t3), the threshold voltage initialization signal Vout1 which is the output signal of the second operational amplifier OP30 of the threshold voltage initialization circuit 30 is changed to the low level. As a result, the output signal of the AND gate AND45 of the threshold voltage generator 40 becomes low, thereby turning OFF the second transistor Q45.

Accordingly, the power VS is not applied to the third resistor R 45. The value of the power VS is divided by the first resistor R41 and the second resistor R42 of the threshold voltage generator 40, and the value of the threshold voltage Vth is controlled from the first threshold voltage Vth(1) to the third threshold voltage Vth(m), as illustrated in FIG. 5C.

In addition, the output signal Vout2 of the first operational amplifier OP20 of the voltage comparator 20 is changed from high to low from the moment that the value of the second voltage signal Vin2 is continually reduced to be the same as that of the threshold voltage Vth(m) (t4) as the capacitor C11 of the second voltage signal generator 10 is discharged. Accordingly, the output signal of the OR gate OR45 of the threshold voltage generator 40 is changed to a low level, thereby turning OFF the second transistor Q45.

The value of the second voltage signal Vin2 is continually reduced and the value of the output signal Vout2 of the voltage comparator 20 is continually maintained low while the value of the first voltage signal Vin1 is maintained, low.

Accordingly, the value of the threshold voltage Vth maintains the value of the third threshold voltage Vth(m), hysteresis voltage is generated in a direction that prevents a chattering of the first operational amplifier OP20 in accordance with the charge/discharge direction of the capacitor C11 of the second voltage signal generator 10 whenever the first voltage signal Vin1 is changed from low to high, or from high to low.

In addition, current of power VS of the threshold voltage generator 40 is not consumed at all when the first transistor Q41 and the second transistor Q42 are turned OFF concurrently.

As described above, in the preferred embodiment of the present invention, there is provided a hysteresis system with a constant threshold voltage regardless of an increase or decrease of the output signal by detecting the increase/ decrease state of the input signal.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A hysteresis system with a constant threshold voltage, comprising:

a second voltage signal generator receiving a first voltage signal for generating a second voltage signal which is gradually increased when the first voltage signal inputted to the hysteresis system is high and is gradually reduced when the first voltage signal inputted to the hysteresis system is low;

a voltage comparator for comparing a threshold voltage signal with the second voltage signal generated from the second voltage signal generator and producing a corresponding value;

a threshold voltage initialization circuit for comparing a reference voltage with the first voltage signal inputted, and producing a threshold voltage initialization signal in accordance with a corresponding to a result; and a threshold voltage generator to which an output signal produced from the voltage comparator and the threshold voltage initialization signal produced from the threshold voltage initialization circuit are fed back, and for producing the threshold voltage signal as a result of such feedback value.

2. The hysteresis system with constant threshold voltage of claim 1, wherein: said second voltage signal generator includes a first resistor with one terminal for receiving said first voltage signal, and a capacitor with one terminal connected to the other terminal of the first resistor and having another terminal which is grounded.

3. The hysteresis system with constant threshold voltage of claim 2 wherein the voltage comparator includes a first operational amplifier.

4. The hysteresis system with constant threshold voltage of claim 3, wherein: said threshold voltage initialization circuit includes a second operational amplifier with a non-inverting input terminal for receiving said first voltage signal and with an inverting input terminal for receiving said reference voltage.

5. The hysteresis system with constant threshold voltage of claim 1, wherein: said threshold voltage generator generates voltage with the same size as that of power supply when said first voltage signal and said second voltage signal are low at the same time.

6. The hysteresis system with constant threshold voltage of claim 5, wherein: said threshold voltage generator includes a first threshold voltage generator for receiving said output signal of said voltage comparator and said threshold voltage initialization signal of said threshold voltage initialization circuit, and generating a first threshold voltage or a second threshold voltage in accordance with an inputted signal; and a second threshold voltage generator for receiving said output signal of said voltage comparator and said threshold voltage initialization signal of said threshold voltage initialization circuit, and having an output coupled to the output of the first threshold voltage generator for maintaining said second threshold voltage of said first threshold voltage generator, or generating third threshold voltage.

7. The hysteresis system with constant threshold voltage of claim 6, wherein the first threshold voltage generator includes an OR gate having a first input terminal connected to an output signal of the voltage comparator and a second input terminal connected to an output signal of the threshold voltage initialization circuit;

a transistor having a base terminal connected to an output terminal of the OR gate and an emitter terminal which is grounded; and first and second resistors for dividing a value of the power supply in accordance with ON/OFF operation of the transistor and producing the divided value to the voltage comparator.

8. The hysteresis system with constant threshold voltage of claim 6, wherein the second threshold voltage generator includes an AND gate having a first input terminal connected to the output signal of the voltage comparator and a second input terminal connected to the ouput signal of the threshold voltage initialization circuit;

a transistor having a base terminal connected to an output terminal of the AND gate and an emitter terminal which is grounded; and a resistor operated by the ON/OFF operation of the transistor and for lowering or boosting an output value from the first threshold voltage generator.

* * * * *